United States Patent
Hsieh et al.

(10) Patent No.: US 8,758,523 B2
(45) Date of Patent: Jun. 24, 2014

(54) METHOD FOR CLEANING PHOTO MASKS AND SEMICONDUCTOR WAFERS USING A JETSPRAY NOZZLE

(75) Inventors: Kun-Long Hsieh, Luchu (TW); Chien-Hsing Lu, Sinying (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 104 days.

(21) Appl. No.: 13/252,274

(22) Filed: Oct. 4, 2011

(65) Prior Publication Data

US 2012/0037192 A1 Feb. 16, 2012

Related U.S. Application Data

(62) Division of application No. 12/261,480, filed on Oct. 30, 2008, now Pat. No. 8,056,832.

(51) Int. Cl.
*B08B 3/00* (2006.01)
*B05B 7/04* (2006.01)

(52) U.S. Cl.
USPC ............. 134/36; 134/31; 134/34; 134/37

(58) Field of Classification Search
USPC ................. 134/31, 34, 36, 37, 42
See application file for complete search history.

(56) References Cited

U.S. PATENT DOCUMENTS

| | | | | |
|---|---|---|---|---|
| 5,129,583 A | * | 7/1992 | Bailey et al. | 239/427 |
| 5,678,766 A | * | 10/1997 | Peck et al. | 239/419 |
| 5,934,566 A | * | 8/1999 | Kanno et al. | 239/398 |
| 5,992,529 A | | 11/1999 | Williams | |
| 6,293,294 B1 | | 9/2001 | Loeb et al. | |
| 6,841,311 B1 | | 1/2005 | Chen et al. | |
| 7,004,181 B2 | * | 2/2006 | Isago et al. | 134/102.1 |
| 2007/0234951 A1 | * | 10/2007 | Lu et al. | 118/300 |
| 2009/0178812 A1 | * | 7/2009 | Solomon et al. | 169/14 |

FOREIGN PATENT DOCUMENTS

CN     1484282 A     3/2004

OTHER PUBLICATIONS

Steve Osborne et al., "Mask Cleaning Strategies—Particle Elimination with Minimal Surface Damage," 25th Annual BACUS Symposium on Photomask Technology, Nov. 8, 2005, 10 pages.

* cited by examiner

*Primary Examiner* — Saeed T Chaudhry
(74) *Attorney, Agent, or Firm* — Duane Morris LLP (57) ABSTRACT

A method of cleaning a photolithographic mask or semiconductor wafer involves mixing a gas and water in a jetspray nozzle and discharging the gas and water jetspray stream from a nozzle onto the photolithographic mask or wafer. The water jetspray stream is made up of a cluster of micro water droplets entrained in the gas having a predetermined size sufficient to dislodge contaminant particles adhered to the surface of the mask. The step of mixing the gas and water includes radially injecting the gas from a first plurality of circumferentially spaced apart gas nozzles into a stream of the water and radially injecting the gas from a second plurality of circumferentially spaced apart gas nozzles into the stream of the water, wherein the second plurality of gas nozzles are spaced above or below the first plurality of gas nozzles and radially offset from the first plurality of gas nozzles.

17 Claims, 8 Drawing Sheets

Fig.8

METHOD FOR CLEANING PHOTO MASKS AND SEMICONDUCTOR WAFERS USING A JETSPRAY NOZZLE

CROSS-REFERENCE TO RELATED APPLICATIONS

This application is a divisional of U.S. application Ser. No. 12/261,480 filed Oct. 30, 2008, which is incorporated by reference herein in its entirety.

FIELD OF THE INVENTION

The present invention generally relates semiconductors and reticles or photo masks used with photolithography processes for patterning semiconductors, and more particularly to apparatuses and methods for cleaning such photo masks or wafers.

BACKGROUND

Photolithography processes are used in semiconductor manufacture to pattern interconnect lines and other features for producing circuits on semiconductor wafer (substrate) surfaces. A conventional photolithography system generally includes components such as a light source, optical transmission and focusing elements, transparent reticles or photo masks, and process electronic controllers. The system is used to project a specific circuit or other feature image, defined by the mask reticle pattern, onto a semiconductor wafer coated with a light sensitive film (photoresist) coating. After image exposure, the film is then developed leaving the printed or other feature image of the circuit on the wafer.

Photo masks used today in semiconductor fabrication include conventional masks with a combination of circuit or other feature patterns formed by alternating transparent regions and opaque regions. Such photo masks typically consist of a substantially transparent base material such as quartz that allows the light to pass through certain regions with an opaque patterned layer having a desired circuit pattern formed thereon that prevents the light from passing through other certain regions. Materials such as chrome have been commonly used for forming the opaque layer and may typically have a thickness on the order of about 1,000 Angstrom. Other materials such as nickel and aluminum have also been used to form the patterned opaque layer on the surface of the photolithographic mask. Whereas conventional photo masks have a generally uniform thickness except for the very thin opaque chrome plated regions, phase shift masks or PSMs are photo masks in which certain regions of the transparent base material have different thicknesses. These latter "phase shift" regions cause a phase shift in the light traveling therethrough and minimize the effects of light diffraction through the photo mask for improved image resolution which may otherwise adversely affect formation of the intended pattern in the photoresist on the wafer. In some types of photo masks such as halftone phase shift masks, materials such as MoSiON has been used for the phase shifter material. In other instances, chromeless phase shift lithography (CPL) technology using chromeless masks have been used to the pattern the photoresist layer on the wafer.

As semiconductor fabrication technology advances to continually higher performing and smaller integrated circuit chips or dies, the accompanying circuits continue to become geometrically smaller and more densely packed on the chips. Accordingly, the pitch or spacing between circuit lines and other features formed on the wafer is concomitantly reduced.

Some problems associated with the shrinking circuit geometries found in the 90 nm and below semiconductor fabrication processes is contamination of the photo mask. As device features shrink, the minimum size threshold for surface contaminants that accumulate during use on the photo mask and which may adversely affect the photolithography process and proper patterning of the photoresist shrinks as well. Particulate contamination on the photo mask may cause defective images to be printed onto the semiconductor wafer which can render an entire chip unusable.

Periodic cleaning of photo masks is therefore necessary to extend mask life time by removing accumulated particulate from the surface of the masks to avoid defective printing and circuit formation problems. Some conventional approaches to cleaning photo masks has been the use of wet chemical cleaning processes using ammonia-based solutions such as SC1/APM (H2O2+NH4OH+H2O), DIH2/hydrogen water (H2O+H2+NH4OH), and NGT (cluster H2O+ammonia gas). Photo mask cleaning may be enhanced by using these solutions in combination with acoustical Megasonic cleaning processes in both dip type or spin type (i.e. ultrasonic waves with frequencies typically higher than 700 KHz, such as 1 MHz and 3 MHz) known in the semiconductor industry. In conventional dip mask cleaning processes, the photo mask is placed into the chemical solution typically contained in a tank. Megasonic waves are then generated within the solution to improve particulate removal from the photo mask.

The foregoing chemical cleaning of photo masks, however, has drawbacks. These known process may seriously damage the pattern (opaque layer features) or sub-resolution assist features (SRAF). After chemical cleaning, an additional step of rigorously rinsing the photo masks with water must be also performed to remove residual ammonia which can otherwise lead to the formation and growth of precipitated chemical defects on mask's chrome pattern that may cause circuit printing and formation problems during photolithography. Such rinsing operations, however, are not always completely effective in removing all residual ammonia. In addition, the chemical cleaning processes raises environmental issues by generating waste chemical solutions that require costly proper disposal and is inconsistent with current "green" manufacturing process goals.

An improved non-chemical photo mask cleaning process is desired.

SUMMARY

A specially-configured photolithographic mask cleaning jetspray nozzle and method for cleaning the same is provided that eliminates the use of chemical agents. In a preferred embodiment, the jetspray nozzle uses deionized water having a predetermined water droplet size produced by the nozzle which efficiently removes contaminants on the mask without damaging the opaque mask pattern or SRAF. In one embodiment, the preferred or target water droplet size is about 10 microns. According to another embodiment, the jetspray nozzle preferably produces a cluster of water droplets having a size distribution of 85% less than or equal to about 30 microns. According to another embodiment, the jetspray nozzle may also be used to clean semiconductor wafers as further described herein.

In one embodiment according to the present invention, a spin type mask cleaning process is advantageously used here. The photo mask is placed onto a controllable high speed rotational chuck. Around the chuck, many programmable controllable swivel arms may be used which are integrated with different type process nozzle heads (i.e. megasonic nozzle, Ozone water nozzle, Jetspray nozzle, etc.) for organic, inorganic & contaminant removal from the photo mask.

According to one embodiment of the present invention, a jetspray nozzle for cleaning a photolithographic mask or semiconductor wafer includes: a water supply inlet; a gas supply inlet; a first row of gas injection nozzles fluidly communicating with the gas supply inlet; a mixing cavity defining a jetspray nozzle outlet; and a flow mixing baffle disposed in the cavity. The mixing baffle is preferably configured and arranged to combine gas and water for delivering a gas-water mixture from the nozzle outlet for removing contaminant particles from the photo mask or semiconductor wafer. In another embodiment, the jetspray nozzle further includes a second row of gas injection nozzles spaced above or below the first row of gas injection nozzles and also fluidly communicating with the gas supply inlet. In one embodiment, the first and second rows of gas injection nozzles are arranged concentrically about a centerline of the nozzle. In a preferred embodiment, the flow mixing baffle may have a conical shape.

According to another embodiment of the present invention, a jetspray nozzle for cleaning a photolithographic mask or semiconductor wafer includes: a water supply inlet; a gas supply inlet; a first row of lower gas injection nozzles communicating with the gas supply inlet and being arranged concentrically about a centerline defined by the nozzle; a second row of upper gas injection nozzles communicating with the gas supply inlet and being arranged concentrically about the centerline of the nozzle; a mixing cavity defining a jetspray nozzle outlet; and a conical flow mixing baffle disposed in the cavity. The mixing baffle is preferably configured and arranged to combine gas and water for delivering a gas-water mixture from the nozzle outlet for removing contaminant particles from the photo mask or semiconductor wafer.

According to another aspect of the invention, a method for cleaning a photolithographic mask or semiconductor wafer is provided. In one embodiment, the method includes: A method of cleaning a photolithographic mask or semiconductor wafer includes: providing a jetspray nozzle including a water inlet, a gas inlet, a plurality of gas injection nozzles, and a jetspray nozzle outlet; supplying water to the jetspray nozzle; supplying gas to the jetspray nozzle; mixing the gas and water in the jetspray nozzle; and discharging a gas and water jetspray stream from the nozzle onto the photolithographic mask or semiconductor wafer. The jetspray stream comprises a cluster of micro water droplets entrained in the gas having a predetermined size sufficient to dislodge contaminant particles adhered to the surface of the mask or wafer.

BRIEF DESCRIPTION OF THE DRAWINGS

The features of the preferred embodiments will be described with reference to the following drawings where like elements are labeled similarly, and in which.

All drawings are schematic and are not drawn to scale.

DETAILED DESCRIPTION

This description of illustrative embodiments is intended to be read in connection with the accompanying drawings, which are to be considered part of the entire written description. In the description of embodiments disclosed herein, any reference to direction or orientation is merely intended for convenience of description and is not intended in any way to limit the scope of the present invention. Relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description only and do not require that the apparatus be constructed or operated in a particular orientation. Terms such as "attached," "affixed," "connected" and "interconnected," refer to a relationship wherein structures are secured or attached to one another either directly or indirectly through intervening structures, as well as both movable or rigid attachments or relationships, unless expressly described otherwise. Moreover, the features and benefits of the invention are illustrated by reference to the preferred embodiments. Accordingly, the invention expressly should not be limited to such preferred embodiments illustrating some possible non-limiting combination of features that may exist alone or in other combinations of features; the scope of the invention being defined by the claims appended hereto.

Figure 1:
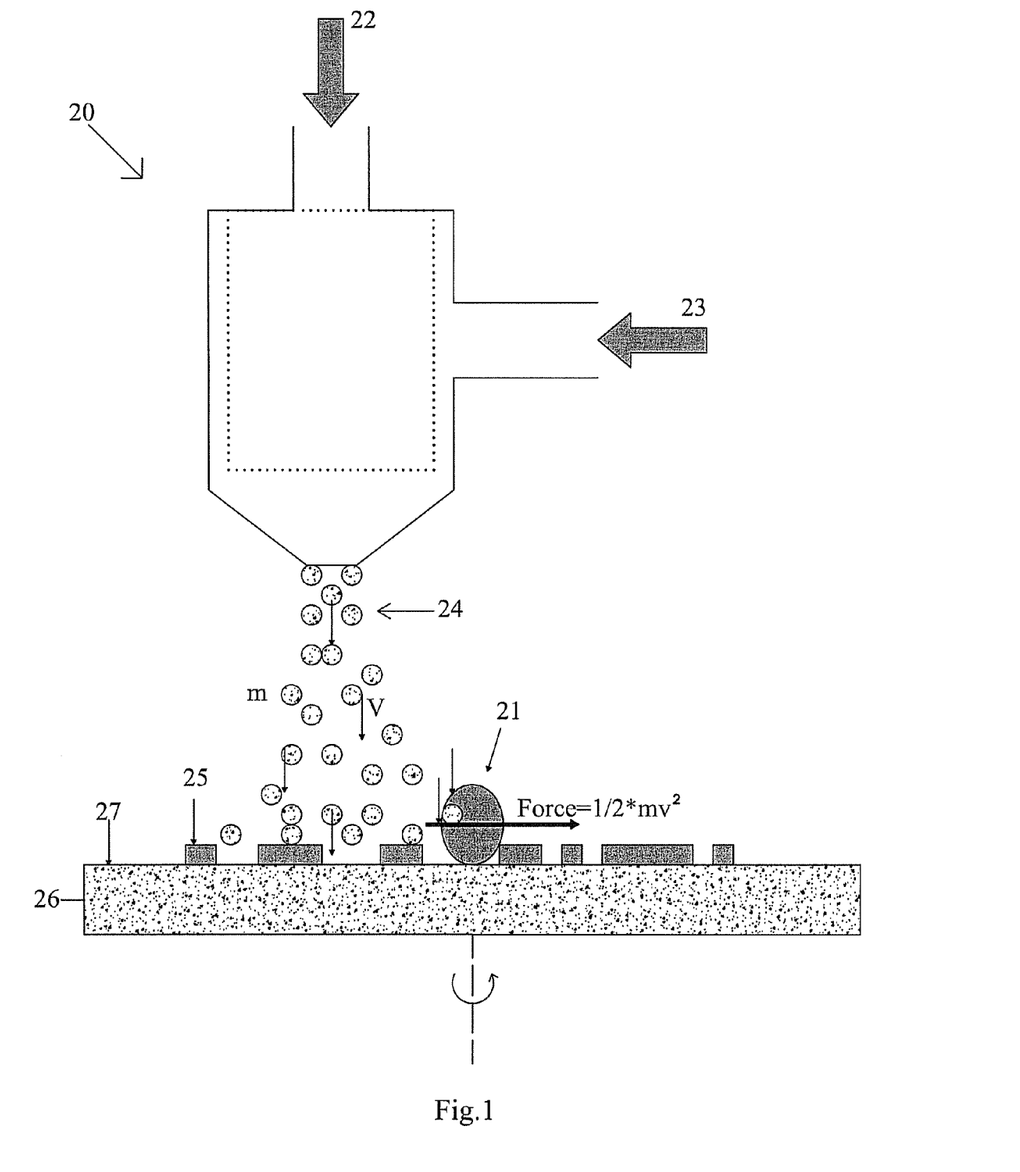
FIG. 1 graphically illustrates the operation of a jetspray nozzle according to the present invention.

Through testing, the inventors have determined that combining deionized water with a pressurized gas in a specially-configured jetspray nozzle described herein produces a high energy focused stream comprising a cluster of micro water droplets entrained in the gas that have a predetermined size capable of producing sufficient force to dislodge inorganic contaminant particles adhered to the surface of the photo mask. The operating principle behind the jetspray nozzle for cleaning the photo mask is illustrated in FIG. 1. A specially-configured jetspray nozzle 20 is supplied with and combines a relatively small amount of deionized water 22 with a high pressure inert or pure gas 23. The deionized water 22 is essentially atomized by the sonic effect in jetspray nozzle 20 by the high pressure gas 23 to produce a concentrated high energy jetspray stream 24 comprising a mixture of gas 23 with clustered water droplets 48 entrained therein. The jetspray stream 24 consists primarily of gas 23 with a smaller amount of clustered water droplets 48. Accordingly, in one embodiment, the volume of gas 23 in the jetspray stream 22 is greater than the volume of water. The concentrated jetspray stream 24 is then directed onto a surface 27 of a photo mask 26 which includes patterned opaque surface features 25 that may include sub-resolution assist features (SRAF) and other features/structures used in conventional and phase-shift photo masks. The water droplets 48 have a force $F=\frac{1}{2} \times mv^2$; wherein m=mass of droplet and v=velocity of the droplet. The transverse force produced by the water parallel to the surface 
27 of mask 26 droplets 48 is sufficient to overcome forces of adhesion or attraction between the contaminant particle 21 and mask 26 for effective cleaning.

An ideal or target water droplet 48 size of 10 microns has been determined to be most effective. However, this droplet size alone is difficult to produce consistently in actual practice. It was further determined through testing that a jetspray stream having a deionized water droplet 48 size distribution of 85% less than about 30 microns effectively removes contaminant particles 21 from the surface 27 of photo mask 26 without seriously damaging the patterned mask surface features. As shown in FIG. 2, this size distribution contains a peak size distribution of about 14% by volume of water droplets 48 of the 10 micron size range which was proven to generate sufficient transverse force (with respect to the surface of the photo mask) to effectively remove contaminant particles from the mask during the jetspray cleaning process.

FIG. 3 schematically illustrates an embodiment of a jetspray nozzle 20 according to the present invention. Jetspray nozzle 20 has a centerline CL which defines a vertical axis VA extending through the centerline of the nozzle from top to bottom as shown, and a horizontal axis HA disposed perpendicular to the vertical axis. Jetspray nozzle 20 includes at least one water supply inlet 50 for supplying water 22 to the nozzle. Water supply inlet 50 may be a tube having a tubular shape in some embodiments, and preferably extends through at least a portion of jetspray nozzle 20 and communicates with cavity 29 as further described herein. In one embodiment, the water 22 is preferably deionized water. Water supply inlet 50 is preferably located at the center and top of nozzle 20. In one embodiment, water supply inlet 50 is preferably aligned concentrically with the centerline CL and vertical axis VA of jetspray nozzle 20. In some embodiments, water supply inlet 50 is preferably sized to allow a flow rate of about 100-200 ml/minute of water 22 to be received by jetspray nozzle 20.

Jetspray nozzle 20 further preferably includes at least one gas supply inlet 28 for supplying a pure or inert gas 23 to the jetspray nozzle, and more preferably may include a plurality of gas supply inlets for evenly feeding the gas to the jetspray nozzle. Gas 23 may be any suitable pure or inert gas such as without limitation N2 (nitrogen), XCDA® (Extreme Clean Dry Air) reticle purge gas available from Entegris Incorporated, etc. As shown in FIG. 3, gas inlet 28 connects to a plurality of branches 33 for further distributing the gas 23 throughout the jetspray nozzle 20 as further described herein. In one embodiment, branches 33 may include a set of upper branches 32 and a set of lower branches 31 as shown. Preferably, each branch 31, 32 is terminated in a gas injection nozzle 34, 39, respectively, which in one embodiment are cone shaped as shown. In one embodiment, injection nozzles 39 define an upper set of nozzles and injection nozzles 34 define a lower set of nozzles as further explained herein. In one embodiment, gas injection nozzles 34 and 39 are concentrically arranged with respect to the centerline CL of jetspray nozzle 20. Gas injection nozzles 34, 39 preferably have a gradually decreasing internal diameter smaller than the diameter of the branches 31, 32 supplying gas 23 to the nozzles to increase the velocity of the gas. Gas injection nozzles 34, 39 also each preferably have a discharge outlet 35 having a reduced diameter 38 which also is preferably smaller than the supply branches 31, 32 for the same reason. In one embodiment, the diameter 38 of discharge outlets 35 may be about 0.1 to 0.3 mm for producing the desired water droplet 48 size when the gas 23 is mixed with the water 22.

With continuing reference to FIG. 3, jetspray nozzle 20 defines an internal mixing cavity 29 for mixing the water 22 with gas 23. Cavity 29 is further defined by a sloping and converging interior surfaces 51 and 53 of the nozzle. In one possible embodiment, as shown, surface 51 preferably slopes outwards away from centerline CL of jetspray nozzle 20 and surface 53 preferably slopes inwards towards centerline CL to concentrate the gas and water jetspray stream 24 mixture. Preferably, in one embodiment, cavity 29 preferably opens outwards and downwards through the bottom of jetspray nozzle 20 to define a jetspray nozzle outlet 42 for delivering the concentrated/focused jetspray stream 24 mixture of gas 23 and deionized water 22 onto the surface 27 of photo mask 26 for cleaning the mask. In one embodiment, jetspray nozzle outlet 42 may have a diameter of about 4 to 6 mm. Preferably, jetspray nozzle outlet 42 may be concentrically aligned with centerline CL of jetspray nozzle 20 as shown. Cavity 29 is in fluid communication with water supply inlet 50 and gas inlet 28 via branches 31, 32 and nozzle tips 35. Gas injection nozzles 34, 39 and water supply inlet 50 preferably terminate at cavity 29 as shown.

In one preferred embodiment, jetspray nozzle 20 is symmetrical in configuration about the centerline CL as shown in FIGS. 3 and 4. Accordingly, in this embodiment, water supply inlet 50, gas injection nozzles 34 and 39, and jetspray nozzle outlet 42 are all arranged concentrically with respect to the centerline CL of the jetspray nozzle for even distribution, mixing, and discharge of the gas 23 and water 22 stream from the jetspray nozzle. In other embodiments, one or more of these features may be asymmetrically arranged with respect to centerline CL of jetspray nozzle 20 so long as uniform mixing and delivery of the gas 23 and water 22 droplets 48 is provided.

Cavity 29 further includes an internal flow mixing baffle 30 disposed in the cavity for combining the water 22 with gas 23. In one possible embodiment, as best shown in FIGS. 3 and 8, mixing baffle 30 may be cone shaped and symmetrical in configuration (shown in cross section in FIG. 3 with left portion omitted to better show gas nozzles). Baffle 30 may be solid or hollow, or a combination of both. In one embodiment, baffle 30 preferably includes a conical tip 36 which is at least partially positioned inside water inlet 22 as shown or relatively proximate to the outlet of inlet 22 and a sloping radial sidewall 52 (see FIG. 8). Baffle 30 is preferably positioned within cavity 29 to form an annular gap 37 between gas nozzles 34, 39 and sidewall 52 of baffle 30. This creates a restricted space to provide uniform distribution and thorough mixing of water 22 into the gas 23 flow for producing entrained water droplet 48 clusters in the gas. In some embodiments, annular gap 37 may be about 0.3 to 0.7 mm. The conical shape of baffle 30 and tip 36 further serves to separate and uniformly distribute the water 22 over the surfaces of the baffle to enhance uniform mixing with the gas 23.

With reference to FIGS. 3-5, gas injection nozzles 34, 39 are configured and arranged to form a double row of gas nozzles with upper nozzles 39 being disposed vertically above lower nozzles 34. FIG. 4 shows a schematic top view of mixing baffle 30, with one possible preferred arrangement of lower and upper gas injection nozzles 34, 39. In this embodiment, jetspray nozzle may be generally circular in configuration when viewed from the top; however, other suitable configurations may be used for the jetspray nozzle. As shown, lower and upper gas injection nozzles 34, 39 are preferably distributed with even spacing around the circumference of jetspray nozzle 20 and baffle 30 to provide uniform injection and distribution of gas 23 into cavity 29 of jetspray nozzle. Accordingly, in one embodiment, upper gas injection nozzles 39 define a first upper row or ring 40 of gas nozzles and lower gas injection nozzles 34 define a second lower row or ring 41 of gas nozzles both concentrically arranged around the vertical axis VA or centerline of jetspray nozzle 20. The upper ring 40 of nozzles 39 is spaced vertically apart from the lower ring 41 of nozzles 34 in one embodiment as shown. Also preferably, in one embodiment, upper gas injection nozzles 39 are preferably radially offset from lower gas injection nozzles 34 by a radial angle A3 to further enhance uniform injection of gas 23 into jetspray nozzle 20 and mixing with the water 22. In one embodiment as shown, a total of 16 gas injection nozzle may be provided comprised of 8 upper nozzles 39 and 8 lower nozzles. In this embodiment, angle A3 may be about 22.5 degrees. It will be appreciated that other numbers of gas injection nozzles may be used so long as uniform mixing between the water 22 and gas 23 may be achieved.

Figure 5:
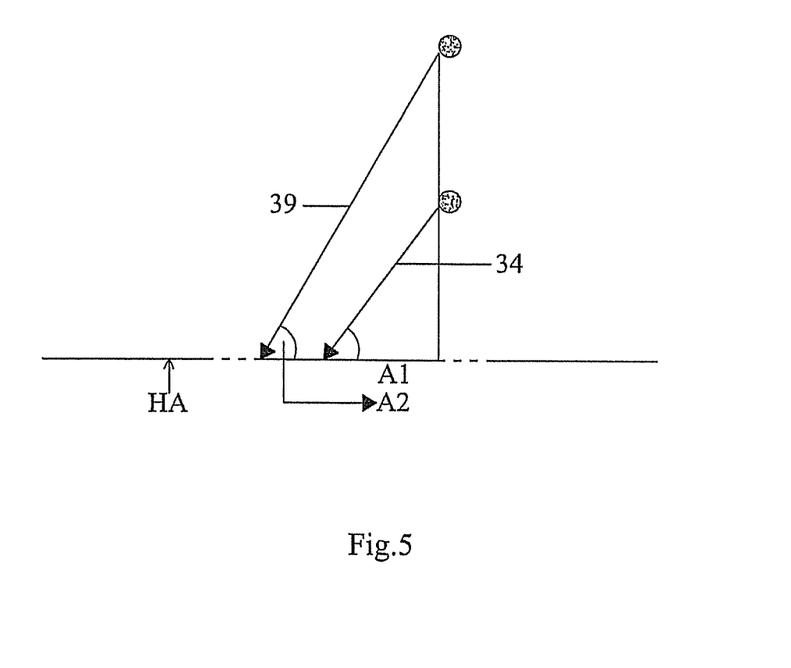
FIG. 5 shows a schematic diagram of one embodiment of a gas injection nozzle arrangement of the jetspray nozzle of FIG. 1.

As shown in FIG. 5, in one embodiment, upper gas injection nozzles 39 may be asymmetrically oriented with respect to lower gas injection nozzle 34 such that each set of nozzles are angled downwards at a different angle with respect to the vertical axis VA and horizontal axis HA of jetspray nozzle 20. Preferably, upper gas injection nozzles 39 are oriented at a sharper or steeper angle with respect to the horizontal axis HA than lower gas injection nozzles 34. Since upper nozzles 39 inject gas 23 at a higher location on cone-shaped mixing baffle 30, the sharper angle directs the gas more vertically to minimize any backflow towards the water supply inlet 50. In one representative embodiment, upper gas nozzles 39 are disposed at angle A2 to the horizontal axis of between about 60-75 degrees and lower gas nozzles 34 are disposed at angle A1 to the horizontal axis of between about 40-55 degrees. Other suitable angles A1, A2 may be used so longer as good mixing between the water 22 and gas 23 may be achieved and gas backflow towards water supply inlet 50 is minimized.

It will be appreciated that uniform injection and distribution of gas 23 into jetspray nozzle 20 is necessary for producing the desired water droplet 48 size distribution described herein.

Jetspray nozzle 20 may be made of any suitable material, such as for example without limitation polymers, and preferably Teflon (e.g. Teflon-PFA, Teflon-PTFA, etc.) in some embodiments.

The operation of jetspray nozzle 20 will now be described. Tests were conducted to optimize the flow and pressure of the deionized water 22 and gas 23 for achieving the desired water droplet 48 size distribution, which in one embodiment is preferably 97% droplet 48 size less than 100 microns, and more preferably 85% droplets 48 less than 30 microns. The water droplet 48 size is proportional to the diameter of the water supply inlet 50, and the water supply pressure and flow rate. The droplet 48 speed or velocity (v) is proportional to the pressure of the gas supply 23 and inversely proportional to the diameter 38 of the gas injection nozzle outlets 35.

Figure 2:
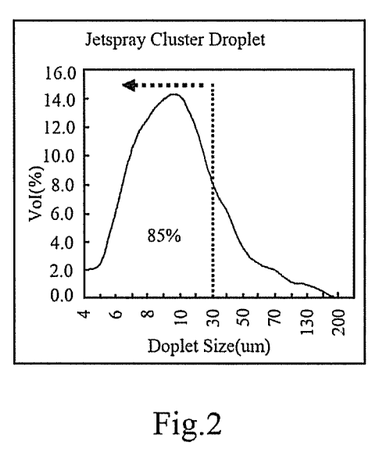
FIG. 2 shows a graph of a preferred water cluster droplet size distribution versus percent volume according to the present invention.
Figure 3:
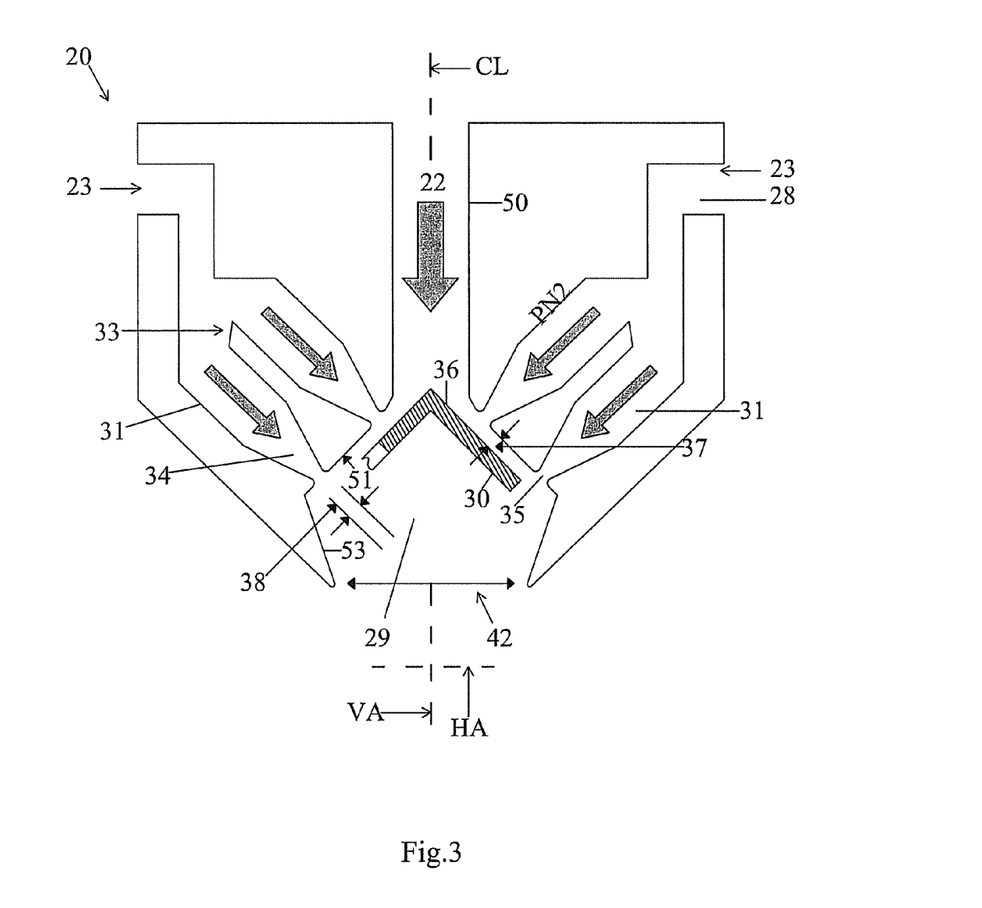
FIG. 3 shows a cross-sectional view of the jetspray nozzle of FIG. 1.
Figure 4:
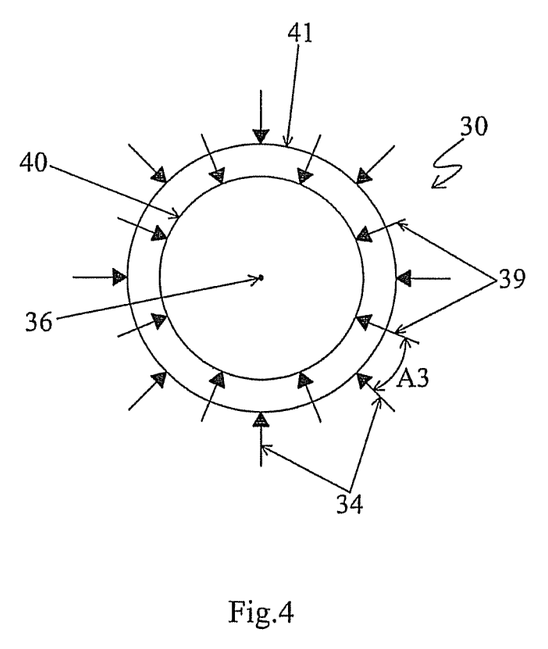
FIG. 4 shows a top view schematic diagram of one embodiment of a flow mixing baffle and gas injection nozzle arrangement of the jetspray nozzle of FIG. 1.
Figure 6:
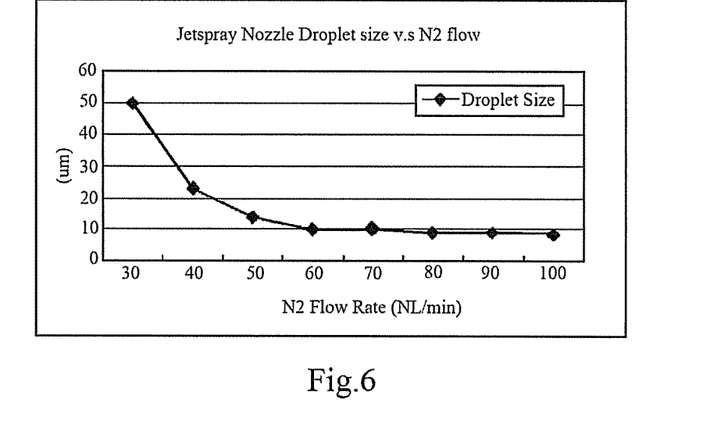
FIG. 6 shows a graph of gas flow rate versus water droplet size according to the present invention.

FIG. 6 is a chart which shows the results of foregoing tests performed to optimize gas flow rate and deionized water droplet 48 size distribution produced by jetspray nozzle 20. The jetspray outlet 42 diameter, gas injection nozzle diameters 38, and gap 37 sizes used for the test were as described above. Water 22 supply flow rate was controlled to about 100-200 ml/minute by varying the water supply pressure. Gas 23 supply pressure was varied from a minimum of about 70 psi to higher pressures to produce gas flow rates varying from about 30-100 liters/minute. As shown in FIG. 6, at a minimum gas flow rate of about 60 liters/minute which corresponded to a deionized water flow rate of 150 ml/minute, the desired 10 micron size water droplets 48 were produced. This produced the desired distribution of 85% droplets 48 less than 30 microns with a 14% volume of the 10 micron size water droplets 48 (shown in FIG. 2). This distribution provided the desired particle removal efficiency as further explained herein.

The operational arrangement of jetspray nozzle and photo mask 26 for the jetspray cleaning process will now be described. Referring again to FIG. 1, jetspray nozzle 29 may be mounted in the front end of a programmable swivel arm around a rotationally movable chuck holder. The photo mask is put onto the rotatable chuck holder (also Z-axis movable). The jetspray nozzle is programmable to move in position in any combination of 3-dimensional directions including forward and backward above photo mask 26 with full spray coverage of the mask during the jetspray cleaning process. Movement of the jetspray nozzle may be controlled by a programmable logic controller executing appropriately configured control logic. This arrangement allows jetspray nozzle 20 to be articulated over and positioned above a plurality of various portions of the photo mask for cleaning. In one embodiment, the jetspray nozzle 20 is preferably positioned so that the jetspray nozzle outlet 42 is approximately 10 mm above the surface 27 of photo mask 26 (i.e. cleaning process gap). Photo mask 26 may be attached to a chuck (not shown) and rotated beneath jetspray nozzle 20 during the cleaning process (as indicated by the rotational arrow shown in FIG. 1). The jetspray nozzle 20 may therefore remain temporarily stationary in one of many possible positions while the photo mask 26 is rotated. In one representative embodiment, a rotational chuck speed of about 150 rpm may be used.

The particle removal efficiency (PRE) of jetspray nozzle 20 was determined using the foregoing operational setup, jetspray nozzle having the two-level gas injection nozzles 34, 39 arrangement, and deionized water and gas flow rates/pressures described herein according to the present invention. A standardized testing procedure used to measure photo mask cleaning PRE was followed. This standard test included using 100 nm size SiN4 particles as the contaminant which were disposed on the surface of a photo mask. A minimum target PRE of 90% was established which is considered good PRE performance when measuring the effectiveness for photo mask cleaning processes. At a PRE of 90% or above, a sufficient number of contaminant particles are removed from the surface of the photo mask so that any remaining particles do not generally interfere with the photolithography process and proper patterning of the photoresist on the wafer. A maximum of 10 minutes spray time was used during which time the photo mask with 100 nm test contaminant particles were exposed to the concentrated cleaning jetspray of clustered deionized water. Exceeding the 10 minute threshold increases the probability of damaging the pattern on the photo mask.

Figure 7:
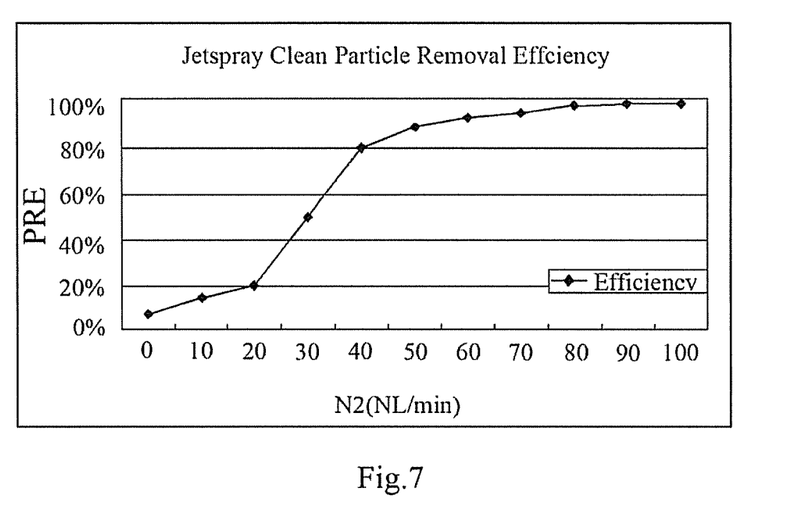
FIG. 7 shows a graph of particle removal efficiency versus gas flow rate according to the present invention.
Figure 8:
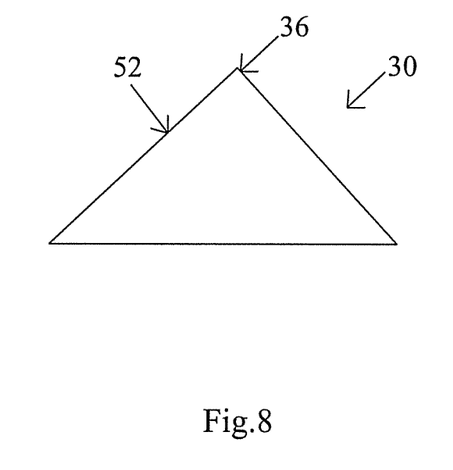
FIG. 8 shows a detailed side view of the flow mixing baffle of the jetspray nozzle of FIG. 1.

The results of the foregoing standardized PRE tests are graphically shown in FIG. 7. At a minimum gas 23 flow rates of about 50 liters/minute, the minimum target 90% PRE was obtained without mask pattern damage when the photo mask 26 was cleaned with clustered deionized water for 10 minutes using a jetspray stream 24 having 85% droplets 48 less than 30 microns in size. As shown in FIG. 7, gas flow rates of greater than 50% produced increasingly higher levels of PRE. The N45 process technology particle count was less than 5 particles each, which is comparable in mask cleaning efficiency to known SC1 or DiH2 cleaning processes augmented by Megasonic waves. In addition, the jetspray cleaning process described herein performed well beyond the N45 process technology (i.e. N32) with no pattern damage and SRAF damage performance comparable with conventional Megasonic cleaning processes. Advantageously, the foregoing PRE performance using the jetspray nozzle and cleaning process according to the present invention was obtained using only deionized water without the addition of any chemicals as required in the prior known photo mask cleaning processes described herein, thereby avoiding chemical usage and related possible precipitated defect formation on the photo mask attributed to ammonia-based prior art processes.

Although the jetspray nozzle and method according to the present invention has been described herein for use in photo mask cleaning, the jetspray nozzle 20 may be used to clean other components involved in semiconductor fabrication. In one embodiment, for example, the jetspray nozzle 20 and method may be used to clean a semiconductor wafer. The wafer cleaning application may use only one of the upper row or ring 40 of gas nozzles 39 or lower row or ring 41 of gas nozzles 34 in some applications because the main purpose of jetspray cleaning on wafer application is for the final rinse process. A single row of nozzles in the jetspray nozzle head is powerful enough on chemical residue and contamination removal where the water droplet 48 uniformity is not as much of a concern as in photomask cleaning.

While the foregoing description and drawings represent preferred or exemplary embodiments of the present invention, it will be understood that various additions, modifications and substitutions may be made therein without departing from the spirit and scope and range of equivalents of the accompanying claims. In particular, it will be clear to those skilled in the art that the present invention may be embodied in other forms, structures, arrangements, proportions, sizes, and with other elements, materials, and components, without departing from the spirit or essential characteristics thereof. One skilled in the art will further appreciate that the invention may be used with many modifications of structure, arrangement, proportions, sizes, materials, and components and otherwise, used in the practice of the invention, which are particularly adapted to specific environments and operative requirements without departing from the principles of the present invention. In addition, numerous variations in the preferred or exemplary methods and processes described herein may be made without departing from the spirit of the invention. The presently disclosed embodiments are therefore to be considered in all respects as illustrative and not restrictive, the scope of the invention being defined by the appended claims and equivalents thereof, and not limited to the foregoing description or embodiments. Rather, the appended claims should be construed broadly, to include other variants and embodiments of the invention, which may be made by those skilled in the art without departing from the scope and range of equivalents of the invention.

What is claimed is:

1. A method of cleaning a photolithographic mask or semiconductor wafer comprising:
   providing a jetspray nozzle including a water inlet, a gas inlet, a plurality of gas injection nozzles, and a jetspray nozzle outlet;
   supplying water to the jetspray nozzle;
   supplying gas to the jetspray nozzle;
   mixing the gas and water in the jetspray nozzle; and
   discharging a gas and water jetspray stream from the nozzle onto the photolithographic mask or wafer, the water jetspray stream comprising a cluster of micro water droplets entrained in the gas having a predetermined size sufficient to dislodge contaminant particles adhered to the surface of the mask,
   wherein the step of mixing the gas and water includes radially injecting the gas from a first plurality of circumferentially spaced apart gas nozzles into a stream of the water, radially injecting the gas from a second plurality of circumferentially spaced apart gas nozzles into the stream of the water, the second plurality of gas nozzles being spaced above or below the first plurality of gas nozzles,
   wherein second plurality of gas nozzles are radially offset from the first plurality of gas nozzles.

2. The method of claim 1, wherein the jetspray stream comprises water droplets having a size distribution of 85% less than about 30 microns.

3. The method of claim 2, wherein the water droplet size distribution includes about 14% by volume of water droplets having a size of about 10 microns.

4. The method of claim 1, wherein the jetspray stream comprises water droplets having a size distribution of 97% less than about 100 microns.

5. The method of claim 1, wherein the gas is supplied to jetspray nozzle at a flow rate of at least about 50 liters/minute or higher.

6. The method of claim 1, wherein the stream of water flows through the jetspray nozzle along a vertical axis defined by the nozzle and the first plurality of gas nozzles are concentrically arranged around the stream of water.

7. The method of claim 1, wherein the first plurality of gas nozzles inject gas at a downward angle with respect to the stream of water.

8. The method of claim 1, wherein the gas and water are mixed in an enlarged mixing cavity that defines a jetspray nozzle outlet, the cavity being radially larger than a water supply inlet through which water is supplied to the jetspray nozzle.

9. The method of claim 8, wherein the gas and water are mixed at a conically shaped baffle disposed in the mixing cavity.

10. The method of claim 9, wherein the step of supplying the water includes injecting a stream of water at an apex of the baffle and dispersing the water along angled sides of the baffle.

11. A method of cleaning a photolithographic mask or semiconductor wafer comprising:
    providing a jetspray nozzle including a water inlet, a first plurality of circumferentially spaced apart gas nozzles arranged concentrically around the water inlet, a second plurality of gas circumferentially spaced apart nozzles arranged concentrically around the water inlet, and a jetspray nozzle outlet axially aligned with the water inlet;
    supplying water through the water inlet to the jetspray nozzle;
    supplying gas to the first and the second plurality of gas nozzles;
    radially injecting the gas from the first and the second plurality of gas nozzles into the water from the water inlet; and
    discharging a gas and water mixture jetspray stream from the nozzle onto the photolithographic mask or wafer, the stream comprising a cluster of micro water droplets entrained in the gas having a predetermined size sufficient to dislodge contaminant particles adhered to the surface of the mask.

12. The method of claim 11, wherein the jetspray stream comprises water droplets having a size distribution of 85% less than about 30 microns.

13. The method of claim 11, wherein the jetspray stream comprises water droplets having a size distribution of 97% less than about 100 microns.

14. The method of claim 11, wherein the gas and water are mixed at a conically shaped baffle disposed in the jetspray nozzle.

15. The method of claim 11, wherein the second plurality of gas nozzles are radially offset from the first plurality of gas nozzles.

16. A method of cleaning a photolithographic mask or semiconductor wafer comprising:

- providing a jetspray nozzle including a water inlet, a first plurality of circumferentially spaced apart gas nozzles arranged concentrically around the water inlet, a second plurality of circumferentially spaced apart gas nozzles arranged concentrically around the water inlet, and a jetspray nozzle outlet axially aligned with the water inlet;
- supplying water through the water inlet to the jetspray nozzle;
- supplying gas to the first and second plurality of gas nozzles;
- radially injecting the gas from the first and second plurality of gas nozzles into the water from the water inlet; and
- discharging a gas and water mixture jetspray stream from the nozzle onto the photolithographic mask or wafer, the stream comprising a cluster of micro water droplets entrained in the gas having a predetermined size sufficient to dislodge contaminant particles adhered to the surface of the mask;
- wherein second plurality of gas nozzles are radially offset from the first plurality of gas nozzles.

17. The method of claim 16, wherein the gas and water are mixed at a conically shaped baffle disposed in the jetspray nozzle.

* * * * *